(12) United States Patent
Jean

(10) Patent No.: US 11,061,612 B2
(45) Date of Patent: Jul. 13, 2021

(54) INTERNAL COMMUNICATION INTERFACE MANAGEMENT

(71) Applicant: Micron Technology, Inc., Boise, ID (US)

(72) Inventor: Sebastien Andre Jean, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 16/417,029

(22) Filed: May 20, 2019

(65) Prior Publication Data
US 2020/0371709 A1 Nov. 26, 2020

(51) Int. Cl.
G06F 3/06 (2006.01)
G06F 13/16 (2006.01)
G11C 16/04 (2006.01)
H03M 7/30 (2006.01)

(52) U.S. Cl.
CPC .......... *G06F 3/0659* (2013.01); *G06F 3/0604* (2013.01); *G06F 3/0679* (2013.01); *G06F 13/1668* (2013.01); *G06F 2212/401* (2013.01); *G11C 16/0483* (2013.01); *H03M 7/30* (2013.01)

(58) Field of Classification Search
None
See application file for complete search history.

(56) References Cited

U.S. PATENT DOCUMENTS

| | | | |
|---|---|---|---|
| 6,883,079 B1 * | 4/2005 | Priborsky | G06F 3/0613 709/247 |
| 7,467,317 B2 | 12/2008 | Matsui | |
| 10,318,301 B2 | 6/2019 | Jean | |
| 2012/0324150 A1 * | 12/2012 | Moshayedi | G06F 3/0619 711/103 |
| 2015/0169443 A1 * | 6/2015 | Lee | G06F 12/0246 711/103 |
| 2015/0242122 A1 * | 8/2015 | Yeh | G06F 3/061 711/103 |
| 2015/0293700 A1 * | 10/2015 | Sasaki | G06F 16/00 711/113 |
| 2015/0378613 A1 * | 12/2015 | Koseki | G06F 3/0619 711/103 |

* cited by examiner

*Primary Examiner* — Charles J Choi
(74) *Attorney, Agent, or Firm* — Schwegman Lundberg & Woessner, P.A.

(57) ABSTRACT

Apparatus and methods are disclosed, including enabling communication between a memory controller and multiple memory devices of a storage system using a storage-system interface, the multiple memory devices each comprising a device controller and a group of non-volatile memory cells, and compressing data using at least one of the device controllers prior to transfer over the storage-system interface to improve an effective internal data transmission speed of the storage system.

18 Claims, 6 Drawing Sheets

INTERNAL COMMUNICATION INTERFACE MANAGEMENT

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of (e.g., multiple) dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Software (e.g., programs), instructions, operating systems (OS), and other data are typically stored on storage systems and accessed by main memory for use by the host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different levels of volatile memory, such as a group of static memory (e.g., a cache, often SRAM), often faster than the main memory, in certain examples, configured to operate at speeds close to or exceeding the speed of the host processor, but with lower density and higher cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
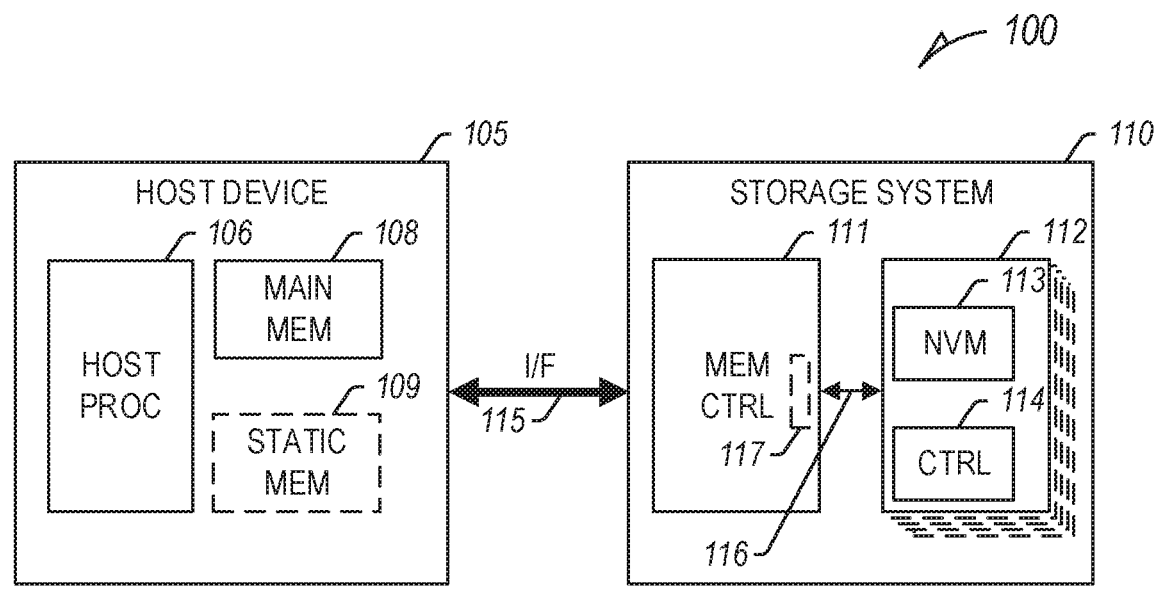
FIG. 1 illustrates an example host system including a host device and a storage system.

Storage systems continue to increase in size and complexity, often having multiple memory devices, each comprising a device controller separate from a memory controller of the storage system. Each of the individual device controllers can be configured to communicate with the memory controller over an internal communication interface separate from a communication interface between the memory controller and a host device.

The present inventor has recognized, among other things, systems, methods, and apparatus to increase effective internal data transmission speeds of an internal communication interface in a storage system having multiple memory devices. In certain examples, such as in storage systems having multiple memory devices, reducing traffic on an internal communication interface (e.g., an Open NAND Flash Interface (ONFI) bus, etc.) can be more beneficial than losing available clock cycles on the individual device controllers of the multiple memory devices. Accordingly, in certain examples, at least one of the multiple device controllers can be configured to compress data prior to transfer over the internal communication interface, not to increase the effective capacity or overprovisioning of the storage system, but to reduce traffic on the internal communication interface (e.g., such as in times of heavy traffic on the internal communication interface, sensed by the memory device, or subject to a control sent by the memory device, etc.), thereby selectively increasing an effective internal data transmission speed of the storage system (or the internal communication interface) separate from (or without) increasing a clock speed or the effective capacity of the storage system.

In certain examples, the storage system can insert padded data to fill the difference between the compressed and uncompressed data, such that the effective capacity of the storage system is not increased. In other examples, the difference between the compressed and uncompressed data can be neglected, such as to retain space and alignment in the storage system to selectively decompress the compressed data.

In an example, a device controller can indicate, such as in metadata of a data unit (e.g., using a flag in the metadata, etc.), that such data is compressed, and must be decompressed by the memory controller of the storage system or by the host device prior to use, or vice versa in situations where the host device or the memory controller is providing the data unit to the memory device. One or more different data compression algorithms can be used. However, to ease alignment in memory, a lossless compression algorithm (e.g., Lempel-Ziv compression, ZIP, etc.) can be used, such that all bits of the compressed data unit can be recovered and the size of the data unit can be determined, or in other examples the size of the uncompressed data unit can be indicated, such as in the metadata of the data unit. In other examples, a compression algorithm having an early abort mechanism can be used to abort such compression if the data is not compatible (e.g., LZ4, etc.).

Separate from or in combination with the above, the present inventor has recognized that padded bits can be omitted from the internal communication interface, either to or from the multiple memory devices, such as between the memory controller and the multiple memory devices. In certain examples, a flag can be set (e.g., by the memory controller or a host processor) and a boundary defined such that the multiple memory devices (e.g., the multiple device controllers, etc.) can automatically pad (e.g., randomly, such as to avoid word line interference, etc.) data to the defined boundary, such as to align data in the multiple memory devices, without transferring such padded bits over the internal communication interface.

FIG. 1 illustrates an example system (e.g., a host system) 100 including a host device 105 and a storage system 110 configured to communicate over a communication interface (I/F) 115 (e.g., a bidirectional parallel or serial communication interface). In an example, the communication interface 115 can be referred to as a host interface. The host device 105 can include a host processor 106 (e.g., a host central processing unit (CPU) or other processor or processing device) or other host circuitry (e.g., a memory management unit (MMU), interface circuitry, etc.). In certain examples, the host device 105 can include a main memory (MAIN MEM) 108 (e.g., DRAM, etc.) and optionally, a static memory (STATIC MEM) 109, to support operation of the host processor (HOST PROC) 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more Joint Electron Device Engineering Council (JEDEC) standards JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller (MEM CTRL) 111 and a non-volatile memory device 112. In an example, the non-volatile memory device 112 can include a number of non-volatile memory devices (e.g., dies or LUNs), such as one or more stacked flash memory devices (e.g., as illustrated with the stacked dashes underneath the non-volatile memory device 112), etc., each including non-volatile memory (NVM) 113 (e.g., one or more groups of non-volatile memory cells) and a device controller (CTRL) 114 or other periphery circuitry thereon (e.g., device logic, etc.), and controlled by the memory controller 111 over an internal storage-system communication interface 116 (e.g., an Open NAND Flash Interface (ONFI) bus, etc.) separate from the communication interface 115. In an example, the memory controller 111 can include decompression circuitry 117 within or separate from the memory controller 111.

Flash memory devices typically include one or more groups of one-transistor, floating gate (FG) or replacement gate (RG) memory cells. Two common types of flash memory array architectures include NAND and NOR architectures. The memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

Each memory cell in a NOR, NAND, 3D Cross Point, HRAM, MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The storage system 110 can include a multimedia card (MMC) solid-state storage device (e.g., micro secure digital (SD) cards, etc.). MMC devices include a number of parallel interfaces (e.g., an 8-bit parallel interface) with a host device 105, and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces between the storage system and a host device. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate (FG) or replacement gate (RG) (or charge trapping) storage structures can be stacked, increasing the number of tiers, physical pages, and accordingly, the density of memory cells in a memory device. Data is often stored arbitrarily on the storage system as small units. Even if accessed as a single unit, data can be received in small, random 4-16k single file reads (e.g., 60%-80% of operations are smaller than 16k). It is difficult for a user and even kernel applications to indicate that data should be stored as one sequential cohesive unit. File systems are typically designed to optimize space usage, and not sequential retrieval space.

The memory controller 111 can receive instructions from the host device 105, and can communicate with the non-volatile memory device 112, such as to transfer data to (e.g., write or erase) or from (e.g., read) one or more of the memory cells of the non-volatile memory device 112. The memory controller 111 can include, among other things, circuitry or firmware, such as a number of components or integrated circuits. For example, the memory controller 111 can include one or more memory control units, circuits, or components configured to control access across the memory array and to provide a translation layer between the host device 105 and the storage system 100.

The non-volatile memory device 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements.

In operation, data is typically written to or read from the storage system 110 in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells or memory arrays can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device. As such, the MLC device may require more metadata bytes for error data than the corresponding SLC device.

In an example, the data in a chunk or data unit can be handled in an optimized manner throughout its tenure on the storage system. For example, the data is managed as one unit during data migration (e.g., garbage collection, etc.) such that the efficient read/write properties are preserved as data is moved to its new physical location on the storage system. In certain examples, the only limit to the number of chunks, data units, or blocks configurable for storage, tagging, etc., are the capacities of the system.

In an example, a super block can refer to one block on each side of a die. If a die has 4 planes, the system has 4 channels. Each channel can include 2 die for a total of 8 die in the system. A write to a super block, in this example, can go to 1 die per channel, on each plane.

Many host systems, such as mobile electronic devices (e.g., smart phones, tablets, internet-of-things (IOT) devices, etc.), can be characterized by periods of heavy use (e.g., bursts) followed by periods (often longer) of relative inactivity (e.g., 5%© active to 95% inactive, 10% active to 90% inactive, etc.). Even during periods of light user activity, the storage system can remain idle (e.g., for 100s of milliseconds). As many storage systems include powerful memory controllers to manage the one or more memory devices (e.g., 600 MHz or greater, etc.), the present inventor has recognized, among other things, that data operations traditionally performed by a host processor (e.g., a central processing unit (CPU), an application processor, a management unit, or one or more other processors or circuitry of a host system, etc.) can be performed by the memory controller. In certain examples, the processing power of the memory controller an act as a shared processor pool for the host device.

The present inventor has recognized, among other things, that data operations traditionally performed by the host processor can be performed directly in the storage system, such as using a memory controller of the storage system (e.g., an SSD controller), for example, in periods of inactivity or low required storage-device activity. As the bulk of data in a host system typically resides in the storage system, it is most efficient to do operations on the memory device. To complete data operations, the host processor typically loads data from the storage system into main memory, which requires time, clock cycles, power associated with the main memory (e.g., DRAM), and causes interface traffic between the host device and the storage system.

For example, setting large memory arrays to all zero values can be expensive when executed by the host processor (e.g., time consuming, requiring excess power, clock signals, activity, etc.). The desired data must be read from the storage system, transferred over a bus, loaded into a register (e.g., of the host processor), set, transferred back, then stored. In contrast, the host processor could send a single instruction to storage system to request that a range is zeroed, overwritten, moved, etc., by the memory controller (e.g., an SSD controller, etc.). In other examples, other more complex operations are possible, configured to offload the host processor for other operations. For example, the memory controller can provide a list of available operations to the host device. The host device can then identify data operations to be performed by the storage system, reducing bus traffic, improving host processor performance, and reducing energy use, etc. In an example, at least one of multiple memory devices in a storage system can compress data on the respective memory device prior to transfer over an internal communication interface.

The concept can be applied to any storage system having one or more dedicated memory controllers or processors to manage the storage systems (e.g., NVM, SSD, Raw NAND, etc.). A set of operations can be pre-defined or submitted at runtime by the host processor (e.g., in executable code using Pearl or python, etc.). Examples include: move, duplicate, trigger (if A, then B), pre-fetch, pattern fill, set bits, find pattern, encryption or decryption (e.g., device-side), compression, decompression, etc. The memory controller can be triggered as needed to offload the host processor, improve device or processor performance, reduce latency, reduce bus traffic, or reduce power usage by the mobile electronic device.

In certain examples, the operations to be performed by the memory controller can be performed as soon as they are requested by the host processor. In other examples, the storage system can wait to perform requested operations until idle time. In other examples, the memory controller can log the requested operation and execute the action on the fly, as the host device requests data from the storage system. For example, if the memory controller receives a request to decompress compressed data. The memory controller could store a compressed copy, perform decompression, store the decompressed copy, and wait for retrieval of the compressed or decompressed version of the received data. Once one is removed from memory, the other can be erased. In other examples, the compressed version of the received data can be stored on the storage system (e.g., to save space), and then decompressed as the host system requests the received data.

In other examples, the host device can write data to the storage system, and then later request an operation be performed on the written data. In an example, requested operations can be received as typical memory operations, or the host processor can apply modes to logical block address (LBA) ranges. A write to a first LBA range can be associated with a first operation. A write to a second LBA range can be associated with a second operation.

Consistent herewith, specific device controllers can perform operations, such as those discussed herein, to reduce traffic on an internal communication interface of the storage system.

Figure 2:
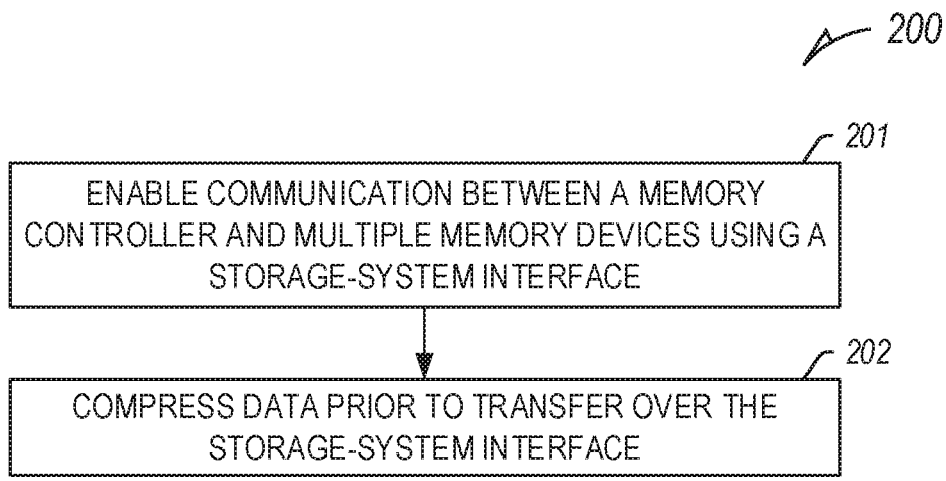
FIGS. 2-5 illustrate example methods of transferring compressed data.

FIG. 2 illustrates an example method 200 to compress data in a memory device of a storage system prior to transfer to a memory controller of the storage system or to a host device. At 201, a storage-system interface (e.g., an internal storage-system communication interface 116) can enable communication between the memory controller and one or more of multiple memory devices of the storage system. In contrast, a communication interface separate from the storage-system interface (e.g., the communication interface 115) can enable communication between the memory controller and the host device.

In certain examples, the host device can provide commands to the memory controller and transfer data associated with the commands between the host device and the storage system using the communication interface. The memory controller can manage received operations among the multiple memory devices. Although described herein as having multiple memory devices, in certain examples, the storage system can include a single memory device controlled by the memory controller.

At 202, data at one or more of the multiple memory devices can be selectively compressed prior to transfer to the memory controller over the storage-system interface, such as using a device controller of the one or more of the multiple memory devices to reduce traffic on the storage-system interface. In certain examples, the device controller can tag the compressed data, such as in the metadata, etc., to indicate that the data is compressed. In certain examples, padded bits can be written to replace the difference between the original data and the compressed data, such as to maintain alignment on the memory device, as well as to enable later alignment or compatibility with the memory device or host device. Just as it may be beneficial to reduce the number of bits transferred over the storage-system interface, in certain examples, it may be beneficial to selectively decompress such compressed data, such as if the host device or the memory controller does not have free clock cycles to decompress compressed data after transfer. Such determinations may be fluid, depending on the usage of each device.

In certain examples, the memory controller can have dedicated circuitry (e.g., compression circuitry) configured to decompress received data prior to transfer to the host device, separate from other operations of the memory controller. In other examples, the memory controller, or memory controller circuitry, can decompress such received data in addition to one or more other memory controller operations.

Figure 3:
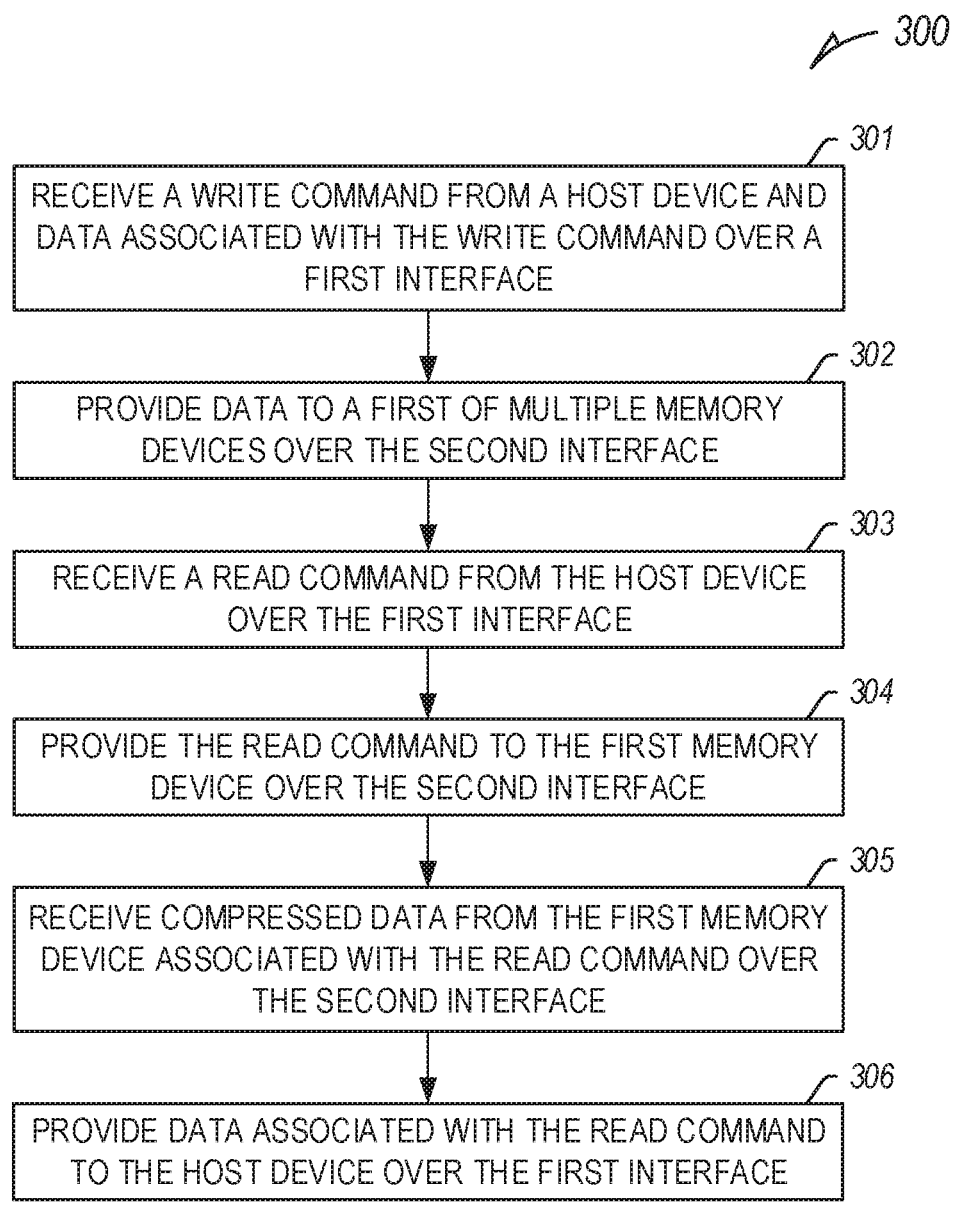

FIG. 3 illustrates an example method 300 to compress data in a memory device of a storage system prior to transfer to a memory controller of the storage system or to a host device.

At 301, a memory controller can receive a write command and data associated with the write command from the host device over a first interface (e.g., a communication interface 115). In other examples, the memory controller can receive one or more other commands from the host device over the first interface.

At 302, the memory controller can provide data to a first memory device of a group of multiple memory devices of the storage system over a second interface separate from the first interface (e.g., an internal storage-system communication interface 116). The memory controller can be configured to manage data and commands to and from the multiple memory devices. However, certain memory management (e.g., garbage collection, wear leveling, etc.) can be performed by device controllers of each of the multiple memory devices. In certain examples, the memory controller can provide data to at least one of the multiple memory devices with a command (e.g., with a flag, etc.) to not compress the provided data.

At 303, the memory controller can receive a read command from the host device over the first interface, and, at 304, can provide the read command to the first memory device over the second interface. At 305, the memory controller can receive compressed data from the first memory device associated with the read command over the second interface. The first memory device can be configured to compress data associated with the read command as it is received (e.g., in response to a write command from the memory controller, the host device, etc.), during an idle time when the first memory device is otherwise idle, or after receiving the read command from the memory controller.

At 306, the memory controller can provide data associated with the read command to the host device over the first interface. In an example, the memory controller can provide compressed data associated with the read command to the host device for the host device to decompress. In this example, one or both of the memory controller or the first memory device can tag the metadata or otherwise indicate that the data is compressed. In certain examples, the data can be tagged to indicate the type of compression. In other examples, the memory controller, or separate circuitry contained within or coupled to the memory controller (e.g., decompression circuitry 117), can decompress the compressed data prior to providing the data associated with the read command to the host device. In this example, the first memory device can tag the data to indicate compression or the type of compression.

Figure 4:
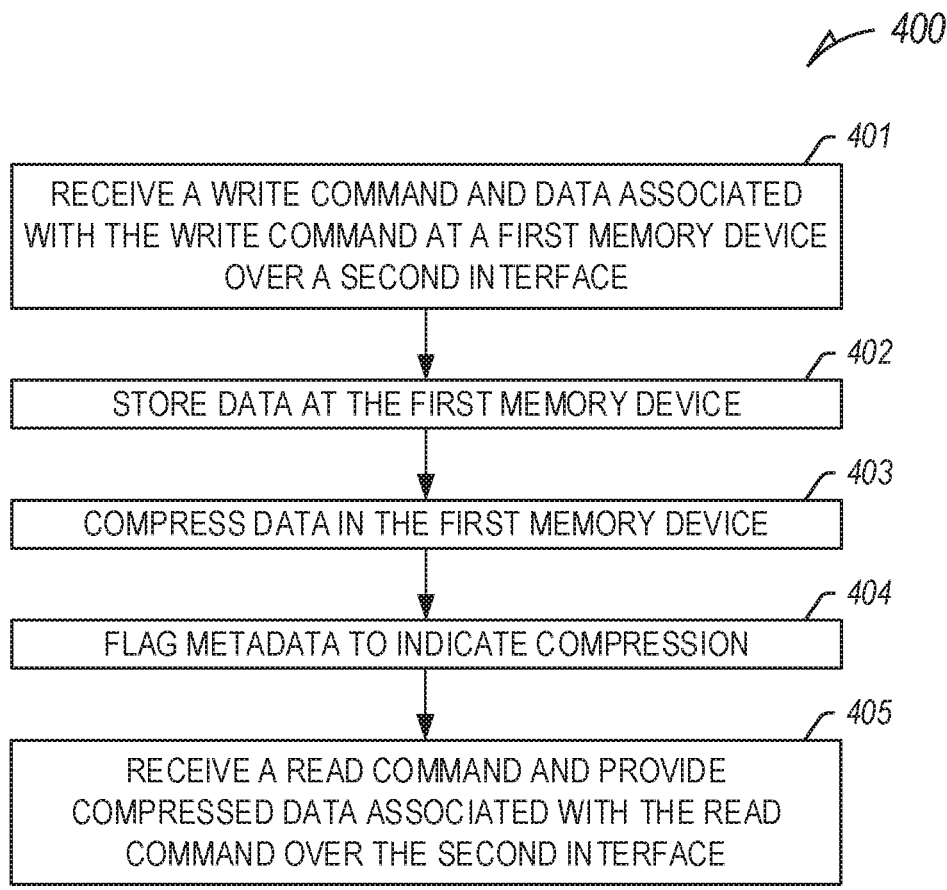

FIG. 4 illustrates an example method 400 to compress data in a first memory device of a group of multiple memory devices of a storage system prior to transfer to a memory controller of the storage system or to a host device.

At 401, the first memory device can receive a write command and data associated with the write command, such as from the memory controller, over a second interface, separate from a first interface between the memory controller and the host device.

In an example, the data associated with the write command can be uncompressed. In other examples, the data can be compressed according to a first type of compression (e.g., a first compression algorithm, etc.).

At 402, the first memory device can store the received data. At 403, the first memory device can selectively compress the received data. In an example, the received data is uncompressed data, and the first memory device can store the uncompressed data. In other examples, the first memory device can store a first copy of the received data, such as in cache or static memory supporting the first memory device, then compress the received data and store the compressed data in non-volatile memory of the first memory device.

In other examples, the received data is compressed data, and the first memory device can store the compressed data (e.g., accordingly to the first type of compression, etc.), or, depending on the type of compression or a desired compression (e.g., if the compressed data is not compressed with a lossless compression algorithm, or an undesired compression algorithm, etc.), the first memory device can decompress the received data and then recompress the received data with a different, second type of compression (e.g., a second compression algorithm, etc.).

In certain examples, the first memory device can compress the received data at the time the first memory device receives the data. In other examples, the first memory device can store the received, uncompressed data in the non-volatile memory, then, at a later time, selectively compress the received data. In an example, the first memory device can wait to perform compression until idle time of the first memory device (e.g., when the first memory device is not receiving write data or providing read data, performing garbage collection or otherwise providing device management, etc.). In other examples, the first memory device can wait to compress the received data until the host device or the memory controller requests the received data. In certain examples, the first memory device can keep both copies of the received data, the uncompressed and the compressed received data, and selectively provide one of the compressed or the uncompressed data, such as in response to a command from the memory controller or the status of or traffic on the second interface.

At 404, the first memory device can flag metadata of the compressed data to indicate that it has been compressed. In certain examples, a second flag can indicate the type of compression. In other examples, a single flag can indicate both compression and the type of compression.

At 405, the first memory device can receive a read command, such as from the host device or the memory controller, and provide compressed data associated with the read command over the second interface. In an example, if the first memory device has not yet compressed data associated with the read command, it can do so once the read command is received, or in response to the received read command.

Figure 5:
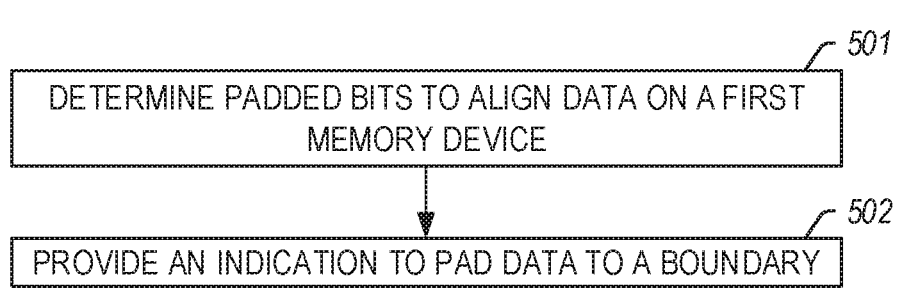

FIG. 5 illustrates an example method 500 including omitting padded bits from a communication interface, such as from a communication interface between a storage system and a host device, or from an internal communication interface between a memory controller and a first memory device of a group of multiple memory devices of the storage system.

At 501, the memory controller can determine one or more padded bits to align data on the first memory device. Alignment can depend on, among other things, the size of the data or data unit or the size of a data access unit (e.g., page size, block size, etc.) on the first memory device.

At 502, instead of inserting padded bits in the data for transfer to the first memory device over the internal communication interface, such as to align data on the first memory device, the memory controller can provide an indication to the first memory device to pad data to a boundary. The first memory device can determine the boundary, and the first memory device can pad bits (e.g., random bits) on the received data in response to the indication and the boundary.

In other examples, a device controller of the first memory device can recognize padded bits, and, in response to a read command, provide data associated with such read command, but omit padded bits from the internal communication interface. The memory controller, or the host device, can receive unpadded data associated with such read command, and if necessary, such as for alignment, etc., add any required padded bits for storage by the memory controller or the host device.

In other examples, the host device can determine one or more padded bits to align data on the first memory device, and instead of inserting padded bits in the data for transfer to the storage system over the communication interface or the internal communication interface, the host device can provide an indication to the storage system to pad data to a boundary.

In certain examples, after the first memory device compresses received data, the first memory device can replace the difference between the compressed and uncompressed data with padded bits, such as to maintain the data structure on the first memory device. Further, if compressed data on the first memory device is later decompressed, it can be replaced in the first memory device to maintain the original data structure on the first memory device, although, in certain examples, on a different page, sub-block, block, etc., as data is typically written or read in pages and erased in blocks.

Figure 6:
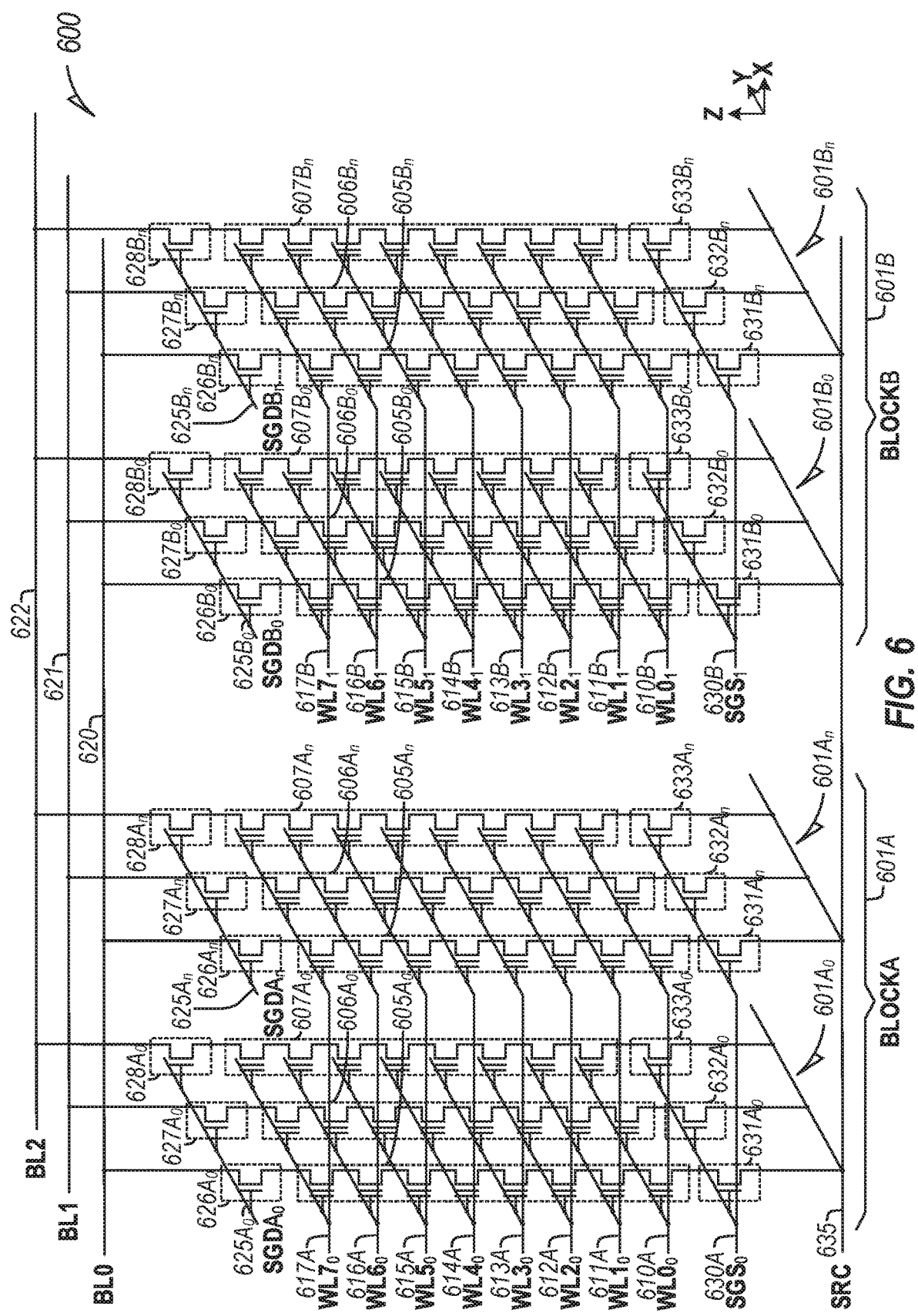
FIG. 6 illustrates an example schematic diagram of a 3D NAND architecture semiconductor memory array.

FIG. 6 illustrates an example schematic diagram of a 3D NAND architecture semiconductor memory array 600 including a number of strings of memory cells (e.g., first-third $A_0$ memory strings 605$A_0$-607$A_0$, first-third $A_n$ memory strings 605$A_n$-607$A_n$, first-third $B_0$ memory strings 605$B_0$-607$B_0$, first-third $B_n$ memory strings 605$B_n$-607$B_n$, etc.), organized in blocks (e.g., block A 601A, block B 601B, etc.) and sub-blocks (e.g., sub-block $A_0$ 601$A_0$, sub-block $A_n$ 601$A_n$, sub-block $B_0$-601$B_0$, sub-block $B_n$ 601$B_n$, etc.). The memory array 600 represents a portion of a greater number of similar structures that would typically be found in a block, device, or other unit of a memory device.

Each string of memory cells includes a number of tiers of charge storage transistors (e.g., floating gate, replacement gate, charge trapping structures, etc.) stacked in the Z direction, source to drain, between a source line (SRC) 635 or a source-side select gate (SGS) (e.g., first-third $A_0$ SGS 631$A_0$-633$A_0$, first-third $A_n$ SGS 631$A_n$-633$A_n$, first-third $B_0$ SGS 631$B_0$-633$B_0$, first-third $B_n$ SGS 631$B_n$-633$B_n$, etc.) and a drain-side select gate (SGD) (e.g., first-third $A_0$ SGD 626$A_0$-628$A_0$, first-third $A_n$ SGD 626$A_n$-628$A_n$, first-third $B_0$ SGD 626$B_0$-628$B_0$, first-third $B_n$ SGD 626$B_n$-628$B_n$, etc.). Each string of memory cells in the 3D memory array can be arranged along the X direction as data lines bit lines (BL) BL0-BL6 620-622), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 600 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 600 includes a control gate (CG) coupled to (e.g., electrically or otherwise operatively connected to) an access line (e.g., word lines (WL) $WL0_0$-$WL7_0$ 610A-617A, $WL0_1$-$WL7_1$ 610B-617B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $626A_0$-$628A_0$ can be accessed using an $A_0$ SGD line $SGDA_0$ $625A_0$, first-third $A_n$ SGD $626A_n$-$628A_n$ can be accessed using an $A_n$ SGD line $SGDA_n$ $625A_n$, first-third $B_0$ SGD $626B_0$-$628B_0$ can be accessed using a $B_0$ SGD line $SGDB_0$ $625B_0$, and first-third B-SGD $626B_n$-$628B_n$ can be accessed using a $B_n$ SGD line $SGDB_n$ $625B_n$. First-third $A_0$ SGS $631A_0$-$633A_0$ and first-third $A_n$ SGS $631A_n$-$633A_n$ can be accessed using a gate select line $SGS_0$ 630A, and first-third $B_0$ SGS $631B_0$-$633B_0$ and first-third $B_n$ SGS $631B_n$-$633B_n$ can be accessed using a gate select line $SGS_1$ 630B.

In an example, the memory array 600 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 600 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 620-622), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 7:
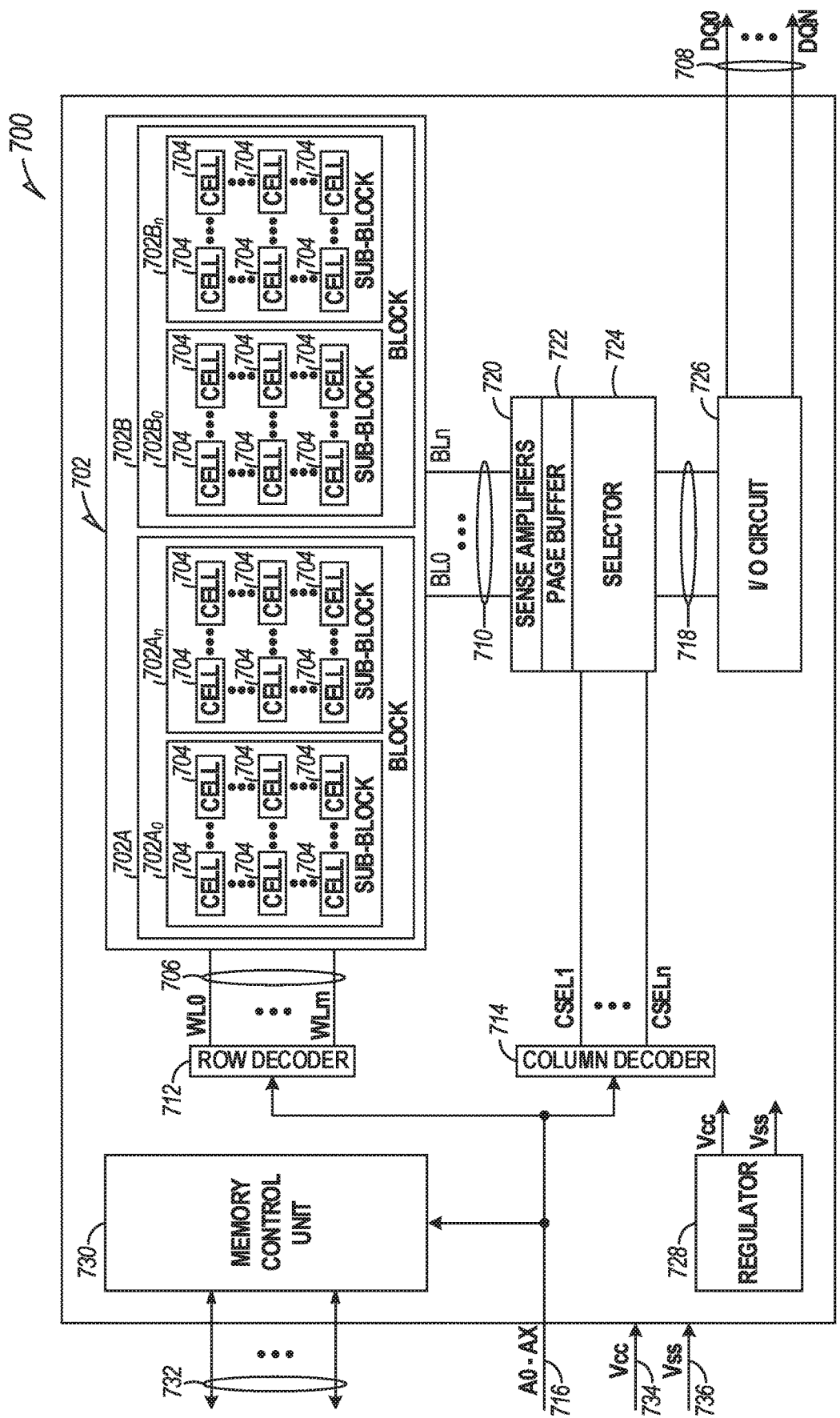
FIG. 7 illustrates an example block diagram of a memory module.

FIG. 7 illustrates an example block diagram of a memory device 700 including a memory array 702 having a plurality of memory cells 704, and one or more circuits or components to provide communication with, or perform one or more memory operations on, the memory array 702. Although shown with a single memory array 702, in other examples, one or more additional memory arrays, dies, or LUNs can be included herein. In certain examples, in a storage system having a number of dies or LUNs, the memory device 700 can represent a block diagram of circuits and components for each die or LUN. The memory device 700 can include a row decoder 712, a column decoder 714, sense amplifiers 720, a page buffer 722, a selector 724, an input/output (I/O) circuit 726, and a memory control unit 730.

The memory cells 704 of the memory array 702 can be arranged in blocks, such as first and second blocks 702A, 702B. Each block can include sub-blocks. For example, the first block 702A can include first and second sub-blocks $702A_0$, $702A_n$, and the second block 702B can include first and second sub-blocks $702B_0$, $7028_n$. Each sub-block can include a number of physical pages, each page including a number of memory cells 704. Although illustrated herein as having two blocks, each block having two sub-blocks, and each sub-block having a number of memory cells 704, in other examples, the memory array 702 can include more or fewer blocks, sub-blocks, memory cells, etc. In other examples, the memory cells 704 can be arranged in a number of rows, columns, pages, sub-blocks, blocks, etc., and accessed using, for example, access lines 706, first data lines 710, or one or more select gates, source lines, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on one or more address lines 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells 704, one or more of the sense amplifiers 720 can read a logic level in the selected memory cell 704 in response to a read current flowing in the memory array 702 through the selected string to the data lines 710.

One or more devices external to the memory device 700 can communicate with the memory device 700 using the I/O lines (DQ0-DQN) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column select signals (CSEL1-CSELn). The selector 724 (e.g., a select circuit) can receive the column select signals (CSEL1-CSELn) and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
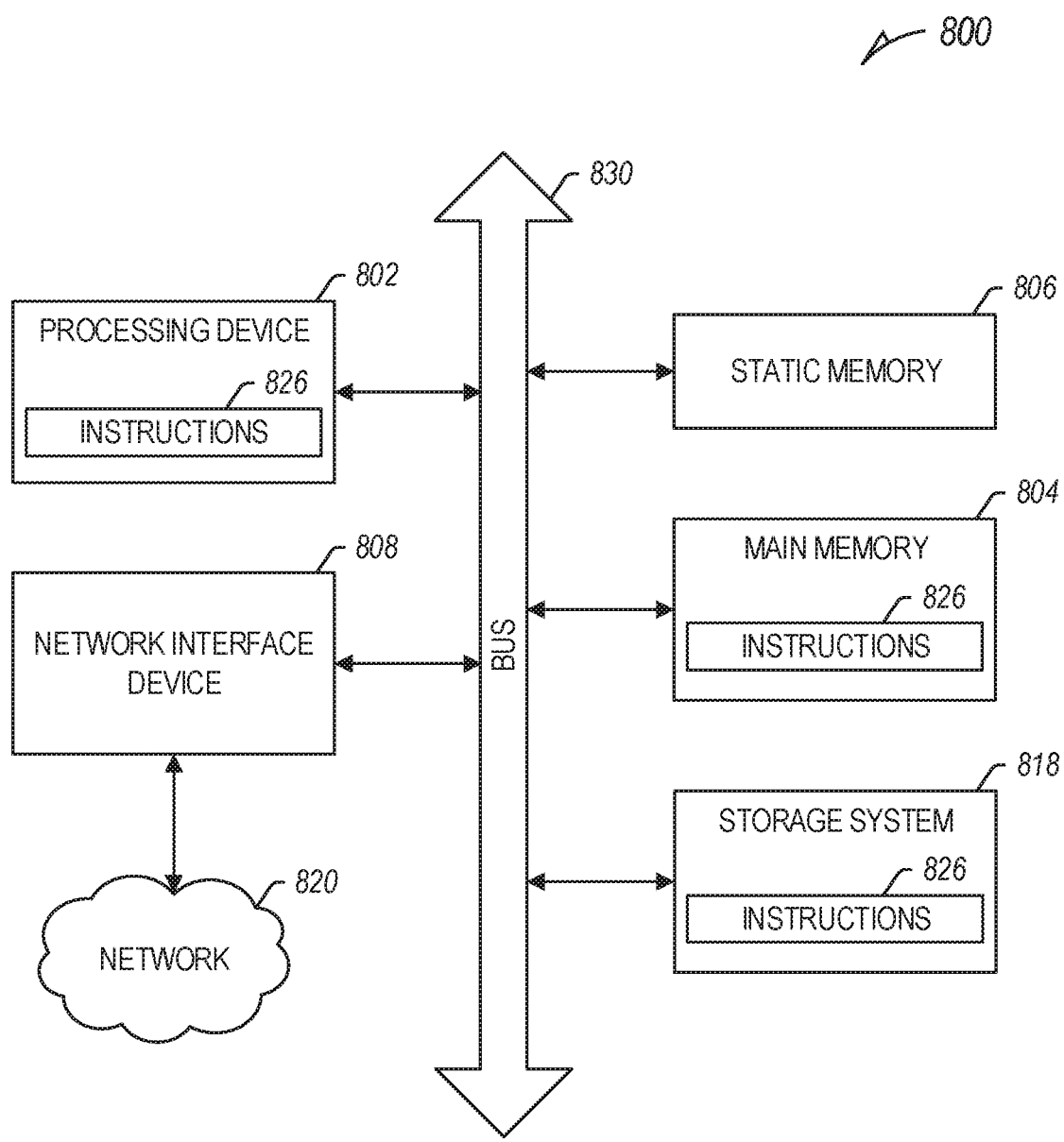
FIG. 8 illustrates an example block diagram of an information handling system.

FIG. 8 illustrates a block diagram of an example machine (e.g., a host system) 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa.

The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 800 may include a processing device 802 (e.g., a hardware processor, a central processing unit (CPU), a graphics processing unit (GPU), a hardware processor core, or any combination thereof, etc.), a main memory 804 (e.g., read-only memory (ROM), dynamic random-access memory (DRAM) such as synchronous DRAM (SDRAM) or Rambus DRAM (RDRAM), etc.), a static memory 806 (e.g., static random-access memory (SRAM), etc.), and a storage system 818, some or all of which may communicate with each other via a communication interface (e.g., a bus) 830.

The processing device 802 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 802 can also be one or more special-purpose processing devices such as an application specific integrated circuit (ASIC), a field programmable gate array (FPGA), a digital signal processor (DSP), network processor, or the like. The processing device 802 can be configured to execute instructions 826 for performing the operations and steps discussed herein. The computer system 800 can further include a network interface device 808 to communicate over a network 820.

The storage system 818 can include a machine-readable storage medium (also known as a computer-readable medium) on which is stored one or more sets of instructions 826 or software embodying any one or more of the methodologies or functions described herein. The instructions 826 can also reside, completely or at least partially, within the main memory 804 or within the processing device 802 during execution thereof by the computer system 800, the main memory 804 and the processing device 802 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 800 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 800 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 826 (e.g., software, programs, an operating system (OS), etc.) or other data are stored on the storage system 818 can be accessed by the main memory 804 for use by the processing device 802. The main memory 804 (e.g., DRAM) is typically fast, but volatile, and thus a different type of storage than the storage system 818 (e.g., an SSD), which is suitable for long-term storage, including while in an "off" condition. The instructions 826 or data in use by a user or the machine 800 are typically loaded in the main memory 804 for use by the processing device 802. When the main memory 804 is full, virtual space from the storage system 818 can be allocated to supplement the main memory 804; however, because the storage system 818 device is typically slower than the main memory 804, and write speeds are typically at least twice as slow as read speeds, use of virtual memory can greatly reduce user experience due to storage system latency (in contrast to the main memory 804, e.g., DRAM). Further, use of the storage system 818 for virtual memory can greatly reduce the usable lifespan of the storage system 818.

The instructions 824 may further be transmitted or received over a network 820 using a transmission medium via the network interface device 808 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 808 may include one or more physical jacks (e.g., Ethernet, coaxial, or phone jacks) or one or more antennas to connect to the network 820. In an example, the network interface device 808 may include a plurality of antennas to wirelessly communicate using at least one of single-input multiple-output (SINK)), multiple-input multiple-output (MIMO), or multiple-input single-output (MISO) techniques. The term "transmission medium" shall be taken to include any intangible medium that is capable of storing, encoding, or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

In Example 1, subject matter (e.g., a system) may comprise a memory controller; multiple memory devices, each comprising a device controller and a group of non-volatile memory cells; and a storage-system interface configured to enable communication between the memory controller and one or more of the multiple memory devices, wherein at least one of the device controllers is configured to compress data prior to transfer over the storage-system interface to improve an effective internal data transmission speed of the storage system.

In Example 2, the subject matter of Example 1 may optionally be configured such that the multiple memory devices comprises first and second memory devices, the first memory device comprises a first device controller and the second memory device comprises a second device controller, the first device controller is configured to compress data prior to transfer over the storage-system interface to improve the effective internal data transmission speed of the storage system, and the first memory device is configured to transfer the compressed data over the storage-system interface.

In Example 3, the subject matter of any one or more of Examples 1-2 may optionally be configured such that the first memory device is further configured to receive data from the memory controller, to compress the received data, to store the compressed data, and to flag the compressed data to indicate compression, the storage system is configured to receive a read command for the received data, and the first memory device is configured to provide the compressed data to the memory controller in response to the received read command.

In Example 4, the subject matter of any one or more of Examples 1-3 may optionally comprise a host device comprising a host processor and a group of volatile memory cells; and a host interface separate from the storage-system interface configured to enable communication between the memory controller and the host device.

In Example 5, the subject matter of any one or more of Examples 1-5 may optionally be configured such that the memory controller is configured to receive a read command from a host device through a host interface, to receive compressed data from the first memory device associated with the read command, and to decompress the compressed data prior to transfer to the host device over the host interface.

In Example 6, the subject matter of any one or more of Examples 1-5 may optionally be configured such that the device controllers are configured to selectively compress data prior to transfer over the storage-system interface to improve the effective internal data transmission speed of the storage-system interface.

In Example 7, the subject matter of any one or more of Examples 1-6 may optionally be configured such that device controllers are configured to selectively compress data prior to transfer over the storage-system interface to improve the effective internal data transmission speed of the storage system separate from increasing a clock speed of the storage system.

In Example 8, the subject matter of any one or more of Examples 1-7 may optionally be configured to comprise the device controllers are configured to selectively compress data prior to transfer over the storage-system interface to improve the effective internal data transmission speed of the storage system separate from increasing an effective capacity of the storage system.

In Example 9, the subject matter of any one or more of Examples 1-8 may optionally be configured such that the memory controller is configured to provide, to a first device controller of a first memory device of the multiple memory devices, an indication to pad data to a boundary to omit padded bits from the storage-system interface; and, in response to the provided indication to pad data to the boundary, the first memory device is configured to pad data to the boundary.

In Example 10, subject matter (e.g., a method of improving an effective internal data transmission speed of a storage system) may comprise enabling communication between a memory controller and one or more of multiple memory devices using a storage-system interface, the multiple memory devices each comprising a device controller and a group of non-volatile memory cells; and compressing data, using at least one of the device controllers, prior to transfer over the storage-system interface to improve an effective internal data transmission speed of the storage system.

In Example 11, the subject matter of Example 10 may optionally be configured such that the multiple memory devices comprise a first memory device, the first memory device comprising a first device controller, wherein compressing data comprises compressing data using the first device controller, wherein the method comprises: transferring the compressed data, using the first memory device, over the storage-system interface.

In Example 12, the subject matter of any one or more of Examples 10-11 may optionally comprise: receiving data from the memory controller at the first memory device;

compressing the received data at the first memory device; storing the compressed data at the first memory device; flagging the compressed data at the first memory device to indicate compression; receiving a read command at the first memory device; and providing the compressed data from the first memory device to the memory controller in response to the received read command.

In Example 13, the subject matter of any one or more of Examples 10-12 may optionally comprise: receiving a read command from a host device; receiving compressed data from the first memory device associated with the read command; and decompressing the received compressed data prior to transfer to the host device over a host interface separate from the storage-system interface.

In Example 14, the subject matter of any one or more of Examples 10-13 may optionally be configured such that compressing data comprises selectively compressing data prior to transfer over the storage-system interface to improve the effective internal data transmission speed of the storage system separate from increasing a clock speed or an effective capacity of the storage system.

In Example 15, the subject matter of any one or more of Examples 10-14 may optionally be configured such that enabling communication between the memory controller and a host device over a host interface separate from the storage-system interface.

In Example 16, the subject matter of any one or more of Examples 10-15 may optionally comprise providing, using the memory controller, an indication to pad data to a boundary to omit padded bits from the storage-system interface to a first device controller of a first memory device of the multiple memory devices; and padding data to the boundary in the first memory device in response to the provided indication to pad data to the boundary.

In Example 17, subject matter (e.g., a non-transitory device-readable storage medium) may comprise instructions that, when executed by controller circuitry of a storage system, cause the storage system to perform operations comprising: enabling communication between a memory controller and one or more of multiple memory devices of the storage system using a storage-system interface, the multiple memory devices each comprising a device controller and a group of non-volatile memory cells; and compressing data, using at least one of the device controllers, prior to transfer over the storage-system interface to improve an effective internal data transmission speed of the storage system.

In Example 18, the subject matter of Example 17 may optionally be configured such that the multiple memory devices comprises a first memory device, the first memory device comprising a first device controller, wherein the operation to compress data prior to transfer over the storage-system interface comprises compressing data using the first device controller prior to transfer over the storage-system interface, and wherein the operations further comprise transferring the compressed data, using the first memory device, over the storage-system interface.

In Example 19, the subject matter of any one or more of Examples 17-18 may optionally be configured such that the operation to compress data prior to transfer over the storage-system interface comprises selectively compressing data prior to transfer over the storage-system interface to improve the effective internal data transmission speed of the storage system.

In Example 20, the subject matter of any one or more of Examples 18-19 may optionally be configured such that the operations comprise: providing, using the memory controller, an indication to pad data to a boundary to omit padded bits from the storage-system interface to a first device controller of a first memory device of the multiple memory devices; and padding data to the boundary in the first memory device in response to the provided indication to pad data to the boundary.

In Example 21, subject matter (e.g., a storage system) may comprise a memory controller; multiple memory devices, each comprising a device controller and a group of non-volatile memory cells; and a storage-system interface configured to enable communication between the memory controller and the number of memory devices, wherein the memory controller is configured to provide, to a device controller of a memory device of the multiple memory devices, an indication to pad data to a boundary to omit padded bits from the internal communication interface, and wherein, in response to the provided indication to pad data to the boundary, the memory device is configured to pad data to the boundary.

In Example 22, subject matter (e.g., a system or apparatus) may optionally combine any portion or combination of any portion of any one or more of Examples 1-21 to comprise "means for" performing any portion of any one or more of the functions or methods of Examples 1-21, or at least one "non-transitory machine-readable medium" including instructions that, when performed by a machine, cause the machine to perform any portion of any one or more of the functions or methods of Examples 1-21.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A storage system comprising:
   a memory controller;
   multiple memory devices, each comprising a device controller and a group of non-volatile memory cells; and
   a storage-system interface configured to enable communication between the memory controller and one or more of the multiple memory devices,
   wherein at least one of the device controllers is configured to:
      selectively compress data prior to transfer over the storage-system interface to improve an effective internal data transmission speed of the storage system; and
      provide, with transfer of compressed data over the storage-system interface, an indication to pad data to a boundary to omit padded bits from the storage-system interface and not increase an effective capacity of the storage system, the boundary determined to replace a difference between a size of the compressed data and a size of the compressed data when it is uncompressed, to maintain alignment after transfer and subsequent decompression.

2. The storage system of claim 1, wherein the multiple memory devices comprises first and second memory devices,
wherein the first memory device comprises a first device controller and the second memory device comprises a second device controller,
wherein the first device controller is configured to compress data prior to transfer over the storage-system interface to improve the effective internal data transmission speed of the storage system, and
wherein the first memory device is configured to transfer the compressed data over the storage-system interface.

3. The storage system of claim 2, wherein the first memory device is further configured to receive data from the memory controller, to compress the received data, to store the compressed data, and to flag the compressed data to indicate compression,
wherein the storage system is configured to receive a read command for the received data, and
wherein the first memory device is configured to provide the compressed data to the memory controller in response to the received read command.

4. The storage system of claim 3, comprising:
a host device comprising a host processor and a group of volatile memory cells; and
a host interface separate from the storage-system interface configured to enable communication between the memory controller and the host device,
wherein the host device and the storage system reside in a mobile electronic device.

5. The storage system of claim 3, wherein the memory controller is configured to receive a read command from a host device through a host interface, to receive compressed data from the first memory device associated with the read command, and to decompress the compressed data prior to transfer to the host device over the host interface, and
wherein the storage system is a single storage device.

6. The storage system of claim 1, wherein the device controllers are configured to selectively compress data prior to transfer over the storage-system interface to improve the effective internal data transmission speed of the storage-system interface.

7. The storage system of claim 1, wherein the device controllers are configured to selectively compress data prior to transfer over the storage-system interface to improve the effective internal data transmission speed of the storage system separate from increasing the effective capacity of the storage system.

8. The storage system of claim 1, wherein the device controllers are configured to:
selectively compress data prior to transfer over the storage-system interface to improve the effective internal data transmission speed of the storage system separate from increasing the effective capacity of the storage system.

9. A method of improving an effective internal data transmission speed of a storage system, comprising:
enabling communication between a memory controller and one or more of multiple memory devices using a storage-system interface, the multiple memory devices each comprising a device controller and a group of non-volatile memory cells;
selectively compressing data, using at least one of the device controllers, prior to transfer over the storage-system interface to improve an effective internal data transmission speed of the storage system; and
providing, using the at least one of the device controllers and with transfer of compressed data over the storage-system interface, an indication to pad data to a boundary to omit padded bits from the storage-system interface and not increase an effective capacity of the storage system, the boundary determined to replace a difference between a size of the compressed data and a size of the co pressed data when it is uncompressed, to maintain alignment after transfer and subsequent decompression.

10. The method of claim 9, wherein the multiple memory devices comprise a first memory device, the first memory device comprising a first device controller,
wherein compressing data comprises compressing data using the first device controller,
wherein the method comprises:
transferring the compressed data, using the first memory device, over the storage-system interface.

11. The method of claim 10, comprising:
receiving data from the memory controller at the first memory device;
compressing the received data at the first memory device;
storing the compressed data at the first memory device;
flagging the compressed data at the first memory device to indicate compression;
receiving a read command at the first memory device; and
providing the compressed data from the first memory device to the memory controller in response to the received read command.

12. The method of claim 11, comprising:
receiving a read command from a host device;
receiving compressed data from the first memory device associated with the read command; and
decompressing the received compressed data prior to transfer to the host device over a host interface separate from the storage-system interface.

13. The method of claim 9, wherein compressing data comprises selectively compressing data prior to transfer over the storage-system interface to improve the effective internal data transmission speed of the storage system separate from increasing a clock speed or the effective capacity of the storage system.

14. The method of claim 9, comprising:
enabling communication between the memory controller and a host device over a host interface separate from the storage-system interface.

15. A non-transitory device-readable storage: medium comprising instructions that, when executed by controller circuitry of a storage system, cause the storage system to perform operations comprising:
enabling communication between a memory controller and one or more of multiple memory devices of the storage system using a storage-system interface, the multiple memory devices each comprising a device controller and a group of non-volatile memory cells;
selectively compressing data, using at least one of the device controllers, prior to transfer over the storage-system interface to improve an effective internal data transmission speed of the storage system; and providing, with transfer of compressed data over the storage-system interface, an indication to pad data to a boundary to omit padded bits from the storage-system interface and not increase an effective capacity of the storage system, the boundary determined to replace a difference between a size of the compressed data and a size of the compressed data when it is uncompressed, to maintain alignment after transfer and subsequent decompression.

16. The non-transitory device-readable storage medium of claim 15, wherein the multiple memory devices comprises a first memory device, the first memory device comprising a first device controller,
wherein the operation to compress data prior to transfer over the storage-system interface comprises compressing data using the first, device controller prior to transfer over the storage-system interface, and
wherein the operations further comprise transferring the compressed data, using the first memory device, over the storage-system interface.

17. The non-transitory device-readable storage medium of claim 15, wherein the operation to compress data prior to transfer over the storage-system interface comprises selectively compressing data prior to transfer over the storage-system interface to improve the effective internal data transmission speed of the storage system.

18. A storage system comprising:
a memory controller;
multiple memory devices, each comprising a device controller and a group of non-volatile memory cells; and
a storage-system interface configured to enable communication between the memory controller and the multiple memory devices,
wherein the memory controller is configured to provide, to a device controller of a memory device of the multiple memory devices, compressed data and an indication to pad data to a boundary to omit padded bits from the internal communication interface, the boundary determined to replace a difference between a size of the compressed data and a size of the compressed data when it is uncompressed, to maintain alignment after transfer and subsequent decompression, and
wherein, in response to the provided indication to pad data to the boundary, the memory device is configured to pad data to the boundary.

\* \* \* \* \*